United States Patent
Ganser et al.

(10) Patent No.: US 6,211,658 B1
(45) Date of Patent: Apr. 3, 2001

(54) BALANCED VOLTAGE REFERENCE CIRCUIT, INTEGRATED WITH ONE OR MORE AMPLIFIER CIRCUITS, FOR OPERATING POINT ADJUSTMENT

(75) Inventors: Siegfried Ganser, Markt Schwaben; Stefan Beyer, Mering, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/549,095

(22) Filed: Apr. 12, 2000

(30) Foreign Application Priority Data

Apr. 13, 1999 (DE) ............................... 199 16 569

(51) Int. Cl.$^7$ ................. G05F 3/16; H03F 3/04
(52) U.S. Cl. ............................ 323/313; 330/301
(58) Field of Search ...................... 323/313, 315, 323/316; 330/7, 257, 286, 288, 301; 327/530, 535, 538, 539

(56) References Cited

U.S. PATENT DOCUMENTS 4,780,690 * 10/1988 Voorman .............................. 330/294
5,736,885 * 4/1998 Wietecha et al. .................... 327/307
5,901,088 * 5/1999 Kraus ............................. 365/185.21

FOREIGN PATENT DOCUMENTS 1 283 964  8/1972  (GB).

OTHER PUBLICATIONS

"Halbleiterschaltungstechnik", Tietze/Schenk, 10$^{th}$ edition, 1993, pp. 62–64.

* cited by examiner

Primary Examiner—Matthew Nguyen
(74) Attorney, Agent, or Firm—Herbert L. Lerner; Laurence A. Greenberg; Werner H. Stemer

(57) ABSTRACT

A balanced voltage reference circuit has a transistor that is operated as an emitter follower and to whose base two resistors are connected in series for beta compensation of the balanced circuit. One end of the smaller resistor which faces away from a transistor base, the smaller resistor being split into two resistor elements, is connected inside the chip to a signal point of an amplifier circuit whose operating point can be adjusted. In which case, one end of an integrated capacitance is connected, as a parallel element of an RC filter, between the two resistor elements of the smaller resistor.

8 Claims, 2 Drawing Sheets

BALANCED VOLTAGE REFERENCE CIRCUIT, INTEGRATED WITH ONE OR MORE AMPLIFIER CIRCUITS, FOR OPERATING POINT ADJUSTMENT

BACKGROUND OF THE INVENTION

Field of the Invention

The invention relates to a balanced voltage reference circuit that is integrated together with one or more amplifier circuits in a circuit module and is intended for operating point adjustment thereof. The balanced voltage reference circuit has a transistor operated as an emitter follower, to whose collector one pole of a direct-current source is connected and to whose base one end of a non-reactive resistor is connected. A further non-reactive resistor is connected on a first end to the collector of the transistor and to the other end of the non-reactive resistor. The further non-reactive resistor has a relatively low resistance and whose second end is connected to a signal point on an amplifier circuit, which signal point determines the operating point of the amplifier circuit.

The operating point of integrated amplifier circuits for signals is adjusted by voltage reference circuits, which are integrated on the same circuit module, in conjunction with operational amplifiers and balanced circuits. This increases the overall noise factor of the amplifier circuits, therefore, additional measures must be taken for noise suppression.

SUMMARY OF THE INVENTION

It is accordingly an object of the invention to provide a balanced voltage reference circuit, integrated with one or more amplifier circuits, for operating point adjustment, which overcomes the above-mentioned disadvantages of the prior art devices of this general type, which provides a capability for adjusting the operating point of low-noise amplifier circuits inside an integrated circuit module, without having to accept an additional housing pin for connection to external filter components.

With the foregoing and other objects in view there is provided, in accordance with the invention, an improved circuit module having a module body and an amplifier circuit with an operating point and a signal point disposed in the module body, the improvement containing:

a balanced voltage reference circuit disposed in the module body and including:

a direct current source;

a first non-reactive resistor having a first end and a second end;

a transistor operated as an emitter follower having a collector connected to the direct-current source and to the second end of the first non-reactive resistor, and a base connected to the first end of the first non-reactive resistor;

a second non-reactive resistor having a relatively low resistance in comparison with the first non-reactive resistor and formed of a first series resistor element having a first end and a second end and a second series resistor element having a first end and a second end, the first end of the first series resistor element connected to the second end of the first non-reactive resistor, the second end of the first series resistor element connected to the first end of the second series resistor element and defining a junction point, the second end of the second series resistor element connected to the signal point of the amplifier circuit and outputting a reference voltage for determining the operating point; and a capacitance having a first end connected to the junction point and a second end to be connected to ground, the capacitance and the second non-reactive resistor defining an RC filter and the capacitance connected as a parallel element of the RC filter.

According to the invention, which relates to the balanced voltage reference circuit of the type mentioned initially, the object is achieved in that the further non-reactive resistor is split into two series resistor elements, and one end of the integrated capacitance is connected, as the parallel element of the RC filter, between the two resistor elements, and the other end of the capacitance is connected to ground.

The non-reactive resistor in the integrated circuit module can be split very easily. The solution according to the invention also requires only a very small layout area. It has been found that the minimum noise factor with a circuit topology analogous to the prior art is approximately the same, and the stability of the DC supply is improved. The other noise parameters $R_n$ (equivalent noise resistance) and $G_{opt}$ (impedance for the minimum noise factor) are not influenced, or are influenced only to a very minor extent, by the circuit according to the invention, so that low-noise power adaptation can be carried out in the same way as in the past.

Other features which are considered as characteristic for the invention are set forth in the appended claims.

Although the invention is illustrated and described herein as embodied in a balanced voltage reference circuit, integrated with one or more amplifier circuits, for operating point adjustment, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
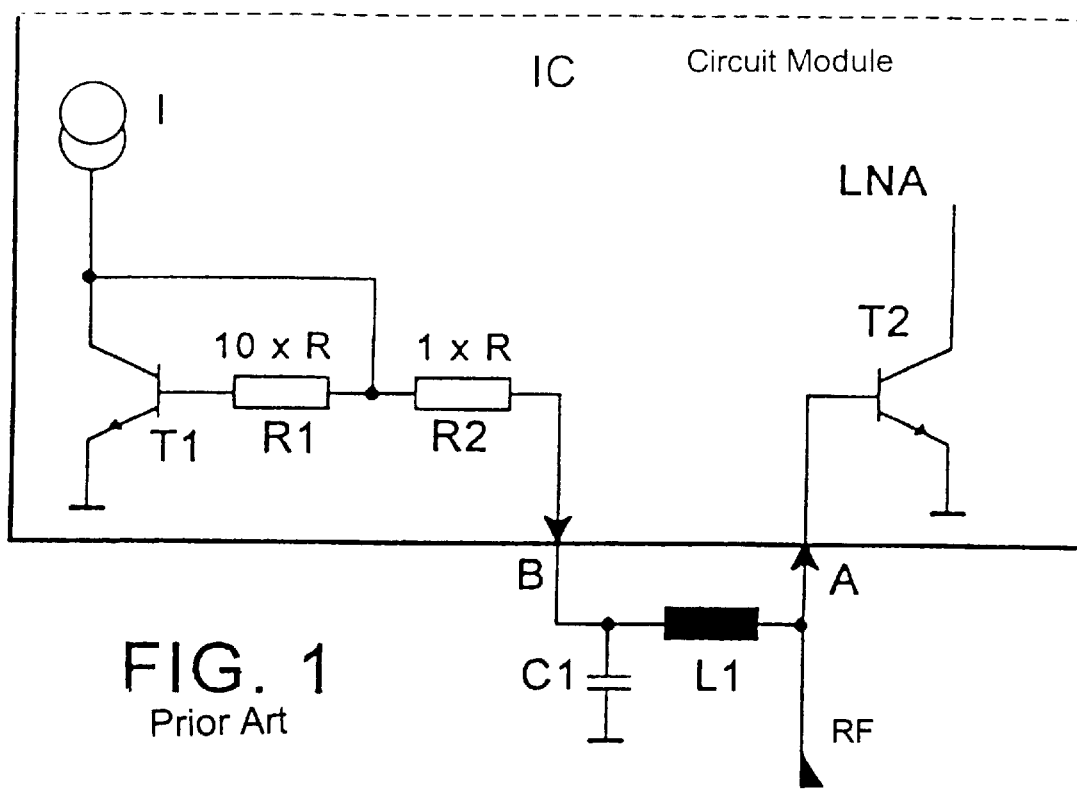
FIG. 1 is a circuit diagram of a prior art balanced voltage reference circuit which, in order to adjust an operating point of an RF amplifier circuit, is partially integrated together with the circuit in a circuit module.

In all the figures of the drawing, sub-features and integral parts that correspond to one another bear the same reference symbol in each case. Referring now to the figures of the drawing in detail and first, particularly, to FIG. 1 thereof, there is shown a known voltage reference circuit that is integrated on a common circuit module IC with a low-noise RF amplifier circuit LNA, in order to adjust an operating point of the amplifier circuit LNA. The illustrated voltage reference circuit with a balanced circuit contains a transistor T1 that is operated as an emitter follower circuit and to whose collector a current source I is connected. The emitter of the transistor T1 is connected to ground, and its base is connected to one end of a non-reactive resistor R1, whose other end is connected first to a collector of the transistor T1 and second to one end of a further non-reactive resistor R2. The resistance of the non-reactive resistor R1 in the illustrated known circuit is 10×R, and the resistance of the non-reactive resistor R2 connected in series with it is 1×R.

The non-reactive resistors R1 and R2 with the values 10×R and 1×R, respectively, are used for beta compensation of the balanced circuit used here, and are obligatory for tolerance reasons. The integrated circuit module IC furthermore contains the low-noise RF amplifier circuit LNA, with a transistor T2. The operating point of the RF amplifier circuit LNA is intended to be adjusted by the voltage reference circuit, which contains the transistor T1 and the current source I and has a balanced circuit. An RF housing pin A is provided on the integrated circuit module IC, in order to receive an RF input signal RF that is to be amplified.

Apart from the RF housing pin A, an additional housing pin B is required for outputting a reference voltage for adjusting the operating point of the RF amplifier circuit LNA, since the reference voltage produced in the integrated circuit module IC must be filtered externally in an LC filter circuit composed of a capacitance C1 and an inductance L1. The filtered DC voltage thus obtained at the output of the inductance L1 is then fed into the integrated circuit module IC, at the RF housing pin A, in order to adjust the operating point of the low-noise amplifier circuit LNA. Integration of the LC filter circuit containing the capacitance C1 and the inductance L1 is impossible owing to the large layout space required for the inductance L1 which would need to be integrated in this case, and owing to the fact that it is difficult to model.

Figure 2:
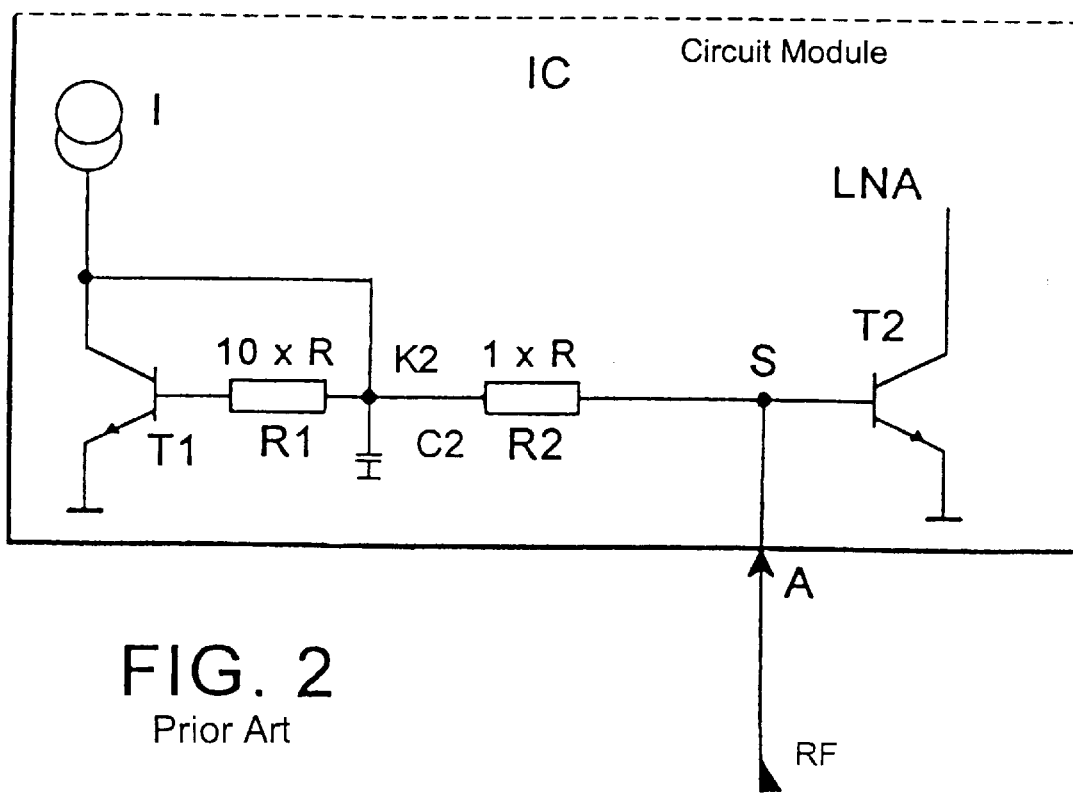
FIG. 2 is a circuit diagram of another prior art balanced voltage reference circuit which, in order to adjust the operating point of the RF amplifier circuit, is completely integrated together with the circuit in the circuit module.

A second known circuit, which is integrated on the common circuit module IC with the low-noise RF amplifier circuit LNA in order to adjust its operating point, is shown in FIG. 2. In this case, the voltage reference circuit with the balanced circuit is constructed essentially in the same way as that in FIG. 1, that is to say it likewise contains the current source I, the transistor T1 and the two non-reactive resistors R1 and R2. The resistance of the non-reactive resistor R1 being 10×R, and the resistance of the non-reactive resistor R2 being 1×R. In contrast to the circuit in FIG. 1, one end of an integrated capacitance C2 is connected as a parallel element to a circuit node K2 located between the resistors R1 and R2, and the other end of the capacitance C2 is connected to ground.

Once again in the same way as in FIG. 1, an external RF input signal RF is passed, for amplification, to the low-noise amplifier circuit LNA via the RF housing pin A on the integrated circuit module IC. The internal reference DC voltage is, however, passed to the base of the transistor T2 of the amplifier circuit LNA, in a different manner to that in FIG. 1, inside the integrated circuit module IC, directly via the non-reactive resistor R2 for adjusting the operating point of the low-noise amplifier circuit LNA via a signal point S, at which the RF input signal RF is present in the illustrated circuit.

This admittedly avoids the need for the additional housing pin B, which is still required for the integrated circuit module shown in FIG. 1. However, in the embodiment shown in FIG. 2, the saving of the pin leads to an increase in the minimum noise factor, since a Q-factor of the filtering is not achieved.

Figure 3:
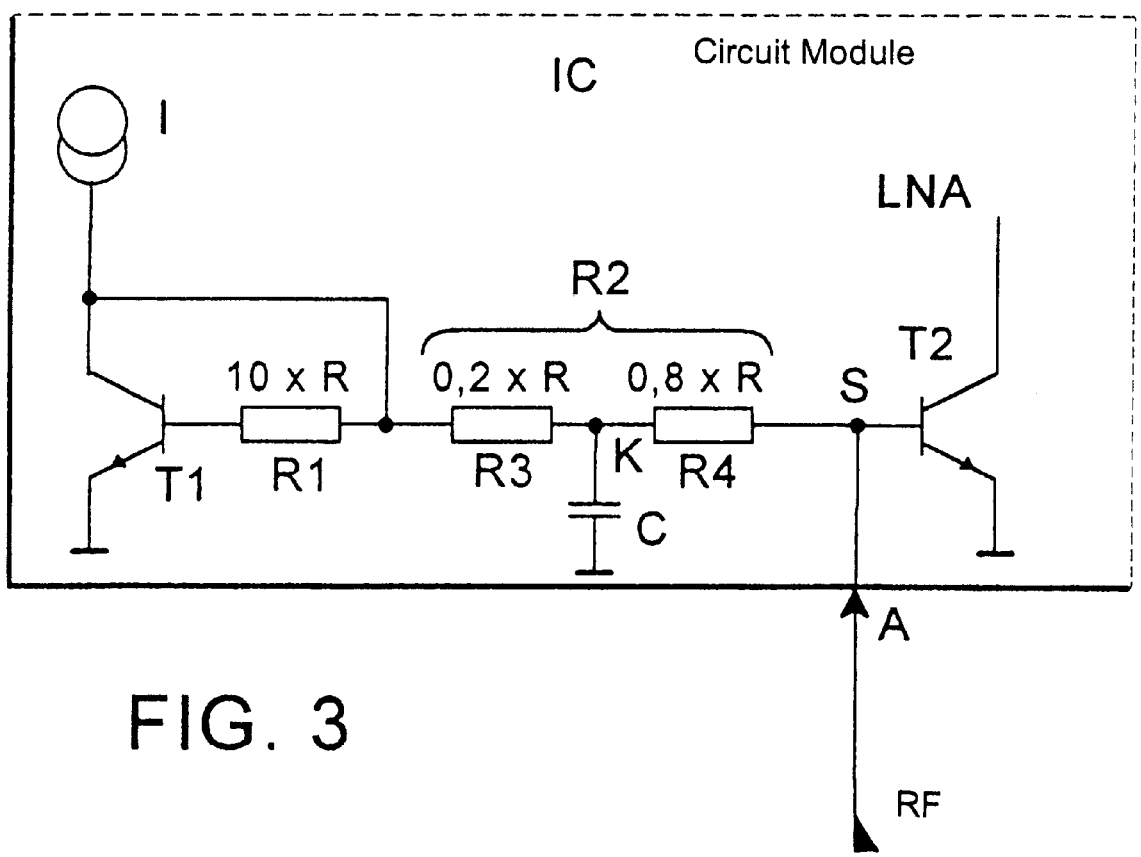
FIG. 3 is a circuit diagram of the balanced voltage reference circuit configured in accordance with the invention which, in order to adjust the operating point of the RF amplifier circuit, is completely integrated together with the circuit in the circuit module.

FIG. 3 shows a circuit configured in accordance with the invention for operating point adjustment, with the low-noise RF amplifier circuit LNA integrated on the common circuit module IC. The voltage reference circuit shown there and having the balanced circuit contains the transistor T1 which is operated as an emitter follower circuit and to whose collector the current source I is connected.

One end of the non-reactive resistor R1 is connected to the base of the transistor T1, whose emitter is connected to ground. The other end of the non-reactive resistor R1 is connected first to the collector of the transistor T1, and second to one end of the non-reactive resistor R2, which is split in two in series.

The resistance of the non-reactive resistor R1 in the illustrated, known circuit is 10×R, and the total resistance of the non-reactive resistor R2 which is split in two and is connected in series with R1 is 1×R. The non-reactive resistor R2 that has been split into two is split into two resistor elements R3 and R4, at a circuit node K.

One end of an integrated capacitance C is connected as a parallel element to the circuit node K between the two resistor elements R3 and R4, and the other end of the capacitance C is connected to ground. The resistor elements R3 and R4 together with the parallel-connected capacitance C form an RC filter.

The integrated circuit module IC furthermore contains the low-noise RF amplifier circuit LNA with the transistor T2. The operating point of the RF amplifier circuit LNA is intended to be adjusted by the voltage reference circuit which contains the transistor T1 and the current source I and has the balanced circuit. The RF housing pin A is provided on the integrated circuit module IC, in order to receive the RF input signal RF that is to be amplified.

The capacitance C and the resistor R3 at the circuit node K between the two resistor elements R1 and R2 result, in an analogous manner to the circuit in FIG. 2 in which the capacitance C2 is connected as a parallel element to the circuit point K2, in any reaction of the RF input signal applied to the signal point S being suppressed. The resistors R3 and R4 and the capacitance C also result in parasitic effects being reduced.

The reference voltage, which is filtered via the integrated RC filter, for adjusting the operating point of the RF amplifier circuit LNA, is supplied directly to the base of the transistor T2 in the low-noise amplifier circuit LNA, inside the integrated circuit module IC, at the signal point S which is inside the module and determines the operating point and at which the RF input signal RF is present in the illustrated exemplary embodiment.

In the exemplary embodiment illustrated in FIG. 3, the resistances of the two series resistor elements R3 and R4 are in the ratio 1 to 4. The resistor R2 can be split into the two resistor elements R3 and R4 in the integrated form without any problems, with only a small layout area being required.

We claim:

1. An improved circuit module having a module body and an amplifier circuit with an operating point and a signal point disposed in the module body, the improvement comprising:
   a balanced voltage reference circuit disposed in the module body and including:
   a direct current source;
   a first non-reactive resistor having a first end and a second end;
   a transistor operated as an emitter follower having a collector connected to said direct-current source and to said second end of said first non-reactive resistor, and a base connected to said first end of said first non-reactive resistor;

a second non-reactive resistor having a relatively low resistance in comparison with said first non-reactive resistor and formed of a first series resistor element having a first end and a second end and a second series resistor element having a first end and a second end, said first end of said first series resistor element connected to said second end of said first non-reactive resistor, said second end of said first series resistor element connected to said first end of said second series resistor element and defining a junction point, said second end of said second series resistor element connected to the signal point of the amplifier circuit and outputting a reference voltage for determining the operating point; and a capacitance having a first end connected to said junction point and a second end to be connected to ground, said capacitance and said second non-reactive resistor defining an RC filter and said capacitance connected as a parallel element of said RC filter.

2. The improved circuit module according to claim 1, wherein said second series resistor element has a resistance greater than said first series resistor element.

3. The improved circuit module according to claim 2, wherein a ratio of said first series resistor element and said second series resistor element is approximately 1:4.

4. The improved circuit module according to claim 1, wherein said first non-reactive resistor has a resistance which is approximately ten times as great as a sum of resistances of said first series resistor element and said second series resistor element.

5. The improved circuit module according to claim 1, wherein the amplifier circuit is a low-noise RF amplifier circuit and the signal point is an RF signal point disposed inside the module body and determines the operating point.

6. The improved circuit module according to claim 1, wherein the amplifier circuit has a transistor with a base connection, and the signal point is inside the module body and is said base connection of said transistor of the amplifier circuit.

7. The improved circuit module according to claim 6, wherein the signal point receives an RF input signal and is disposed inside the module body and the amplifier circuit is a low-noise amplifier circuit, the RF input signal together with the reference voltage determining the operating point of said transistor of the amplifier circuit and the reference voltage being filtered in said second non-reactive resistor connected to said capacitance.

8. A circuit module, comprising:

an amplifier circuit with an operating point and a signal point; and a balanced voltage reference circuit, including:
   a direct current source;
   a first non-reactive resistor having a first end and a second end;
   a transistor operated as an emitter follower having a collector connected to said direct-current source and to said second end of said first non-reactive resistor, and a base connected to said first end of said first non-reactive resistor;
   a second non-reactive resistor having a relatively low resistance in comparison with said first non-reactive resistor and formed of a first series resistor element having a first end and a second end and a second series resistor element having a first end and a second end, said first end of said first series resistor element connected to said second end of said first non-reactive resistor, said second end of said first series resistor element connected to said first end of said second series resistor element and defining a junction point, said second end of said second series resistor element connected to said signal point of said amplifier circuit and outputting a reference voltage for determining the operating point; and
   a capacitance having a first end connected to said junction point and a second end to be connected to ground, said capacitance and said second non-reactive resistor defining an RC filter and said capacitance connected as a parallel element of said RC filter.

* * * * *